United States Patent
Chen et al.

(10) Patent No.: US 6,305,062 B1
(45) Date of Patent: Oct. 23, 2001

(54) PREVENTIVE MAINTENANCE APPARATUS FOR CMP TOP-RING'S BACKING-FILM AND THE METHOD THEREOF

(75) Inventors: Ting-Kou Chen, Tainan; Yong-Sen Liao, Miaoli Hsien; Frank J. C. Chang, Hsinchu Hsien, all of (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/553,826

(22) Filed: Apr. 21, 2000

(30) Foreign Application Priority Data

May 9, 2000 (CH) ............................................. 088121051

(51) Int. Cl.⁷ ............................... B23P 19/04; B23P 6/00
(52) U.S. Cl. ..................... 29/402.08; 29/407.09; 29/407.1; 29/464
(58) Field of Search .................... 29/402.03, 402.08, 29/402.11, 402.12, 402.14, 402.15, 407.09, 407.1, 464, 426.1, 559; 269/21; 451/56

(56) References Cited

U.S. PATENT DOCUMENTS

| | | | |
|---|---|---|---|
| 4,759,892 | * | 7/1988 | Bonzo ..................................... 29/464 |
| 4,939,942 | * | 7/1990 | Thome et al. .......................... 29/407 |
| 5,862,583 | * | 1/1999 | Ammann et al. ....................... 29/464 |

* cited by examiner

Primary Examiner—David P. Bryant
Assistant Examiner—Jermie E. Cozart
(74) Attorney, Agent, or Firm—Ladas & Parry (57) ABSTRACT

A preventive maintenance method and apparatus for quickly and precisely replacing a backing-film of a CMP machine is provided. In comparison with a conventional backing-film, the backing-film according to the present invention is pre-drilled by laser in order to bypass the restriction set by a conventional manual drilling process on the backing-film. In addition, a PM apparatus for the backing-film comprises an aligning panel having a plural first pins in order to quickly check whether drilled holes of the backing-film are aligned with the corresponding air holes or not. Therefore, the CMP machine down time due to the PM can be reduced.

6 Claims, 14 Drawing Sheets

PREVENTIVE MAINTENANCE APPARATUS FOR CMP TOP-RING'S BACKING-FILM AND THE METHOD THEREOF

BACKGROUND OF THE INVENTION

1. Field of the Invention

The present invention relates to a preventive maintenance (PM) method and apparatus for quickly and precisely replacing a backing-film of a chemical mechanical polishing (CMP) machine; in particular, the invention relates to a method and an apparatus capable of enhancing the efficiency during a PM procedure by simplifying the procedure.

2. Description of the Related Art

Figure 1:
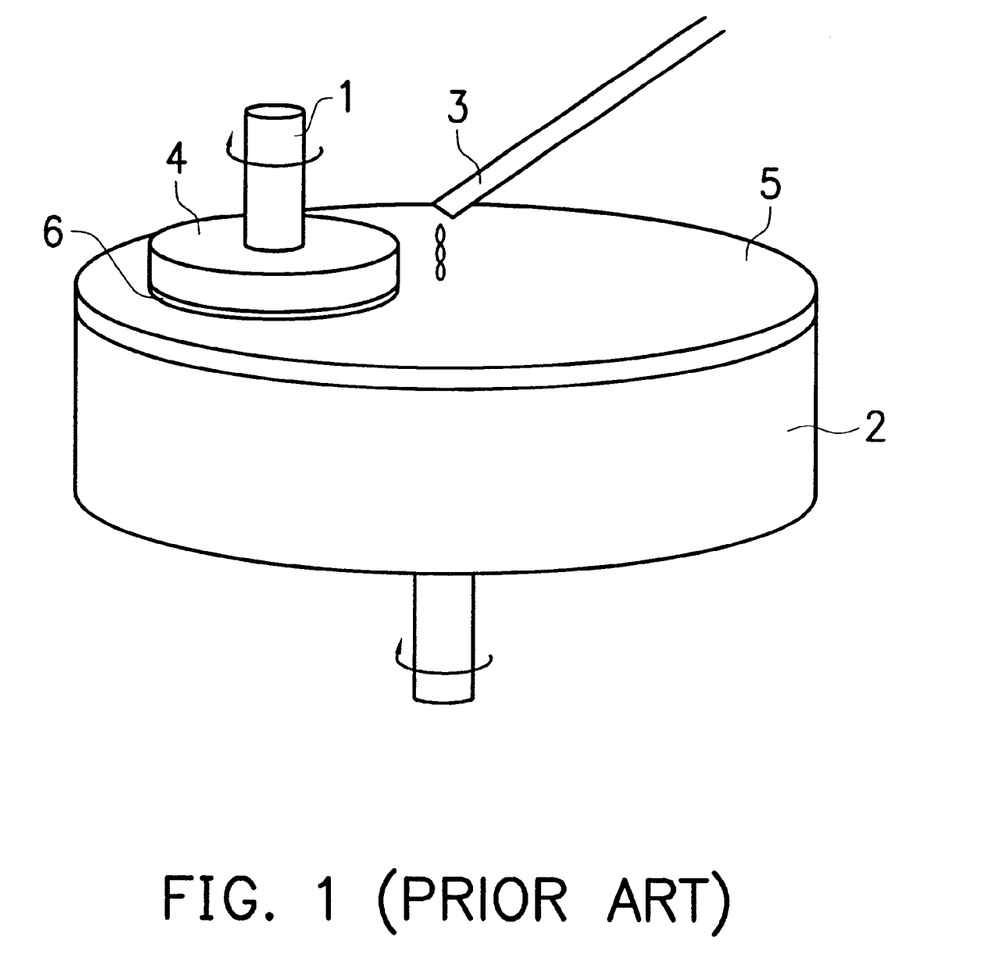
FIG. 1 is a schematic view showing a CMP machine.

In the past years, CMP has emerged as a critical technology in the area of wafer planarization for companies that manufacture integrated circuit (IC) devices. FIG. 1 shows a schematic view of a CMP machine, wherein the CMP machine shown consists of a shaft 1, a top-ring 4 disposed on the shaft 1, a polishing slurry-distributing system 3, a platform 2, and a polishing pad 5 disposed on the platform 2. In addition, a wafer 6 is held by the top-ring 4.

Figure 2A:
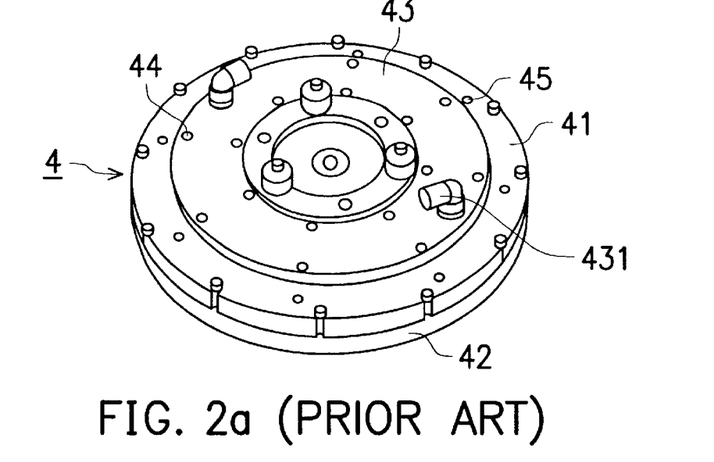
FIG. 2a, FIG. 2b are schematic views showing a top-ring, wherein a surface of the top-ring that is to be coupled with a shaft is shown in FIG. 2a, and a surface of the top-ring that is to be in contact with a polishing pad is shown in FIG. 2b.
Figure 2B:
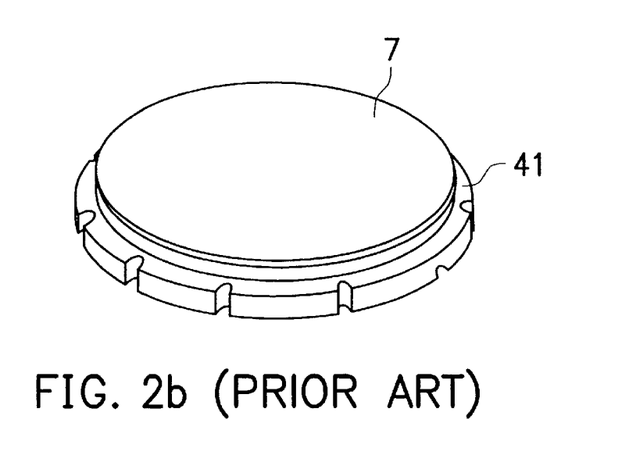

FIG. 2a and FIG. 2b are schematic views of the top-ring 4, wherein FIG. 2a shows a surface of the top-ring 4 which is connected with the shaft 1 of the top-ring 4. The top ring 4 comprises a body 41, a guide-ring 42, and a cover 43, wherein a closed space is formed between the cover 43 and the body 41. By connecting a port 431 of the cover 43 with a pumping system (not shown), the wafer can be sucked by air holes 411, referring to FIG. 3f and FIG. 3g, located in the top-ring 4. The body 41 and the cover 43 are coupled by plural screws 44, whereas the body 41 and the guide-ring 42 are coupled by plural screws 45.

Figure 2C:
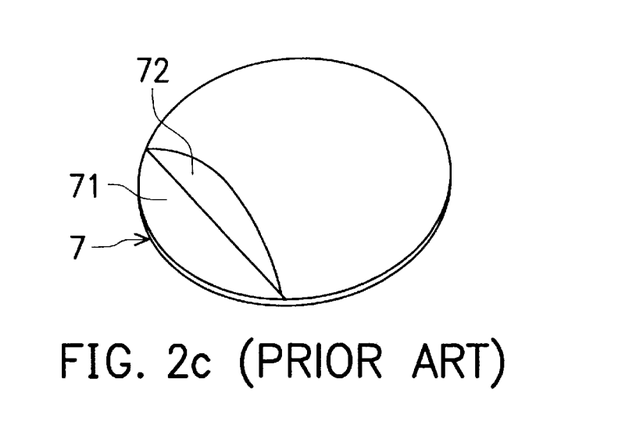
FIG. 2c is a schematic view showing a new, unused backing-film.

FIG. 2b shows the other surface of the top ring 4, on the opposite side, which is in contact with the polishing pad 5. In FIG. 2b, the guide-ring 42 is disassembled. A backing-film 7, without being drilled, is adhered to this surface. As shown in FIG. 2c, a surface of the backing-film 7 is provided with a sticker 71 such that the unused sticker 71 is covered by a paper 72 to protect the adhesive surface of the sticker 71.

Figure 3A:
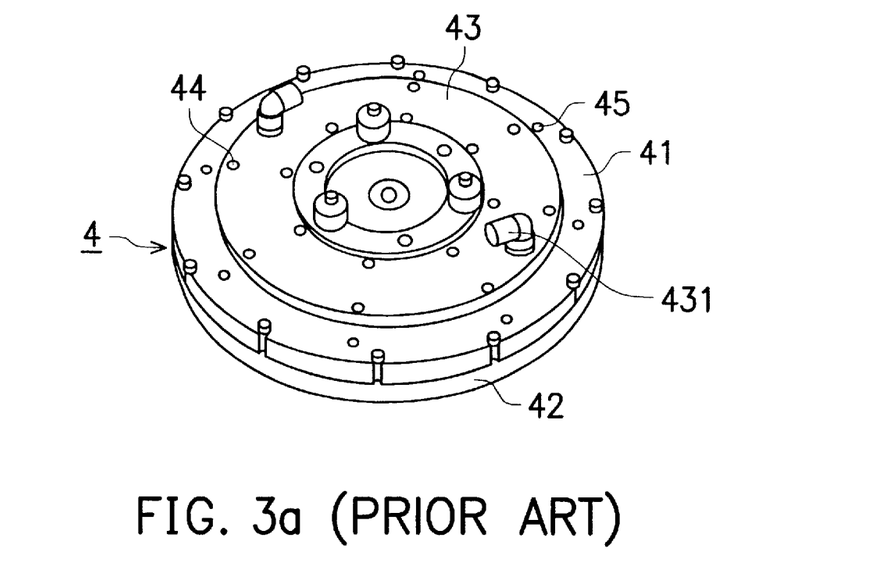
Figure 3B:
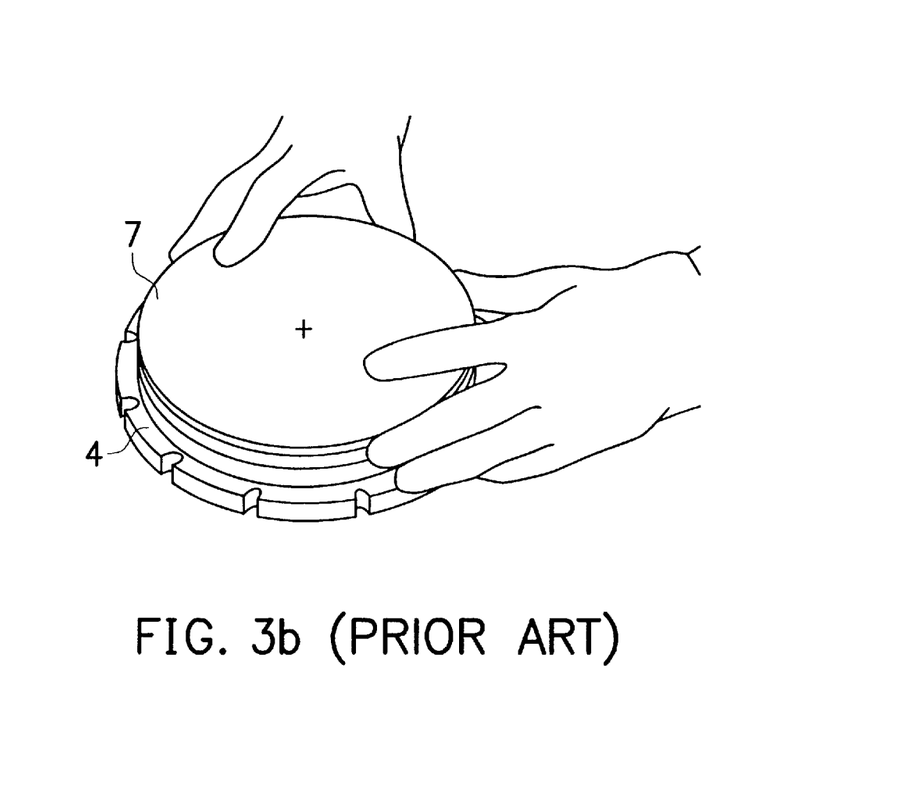
Figure 3C:
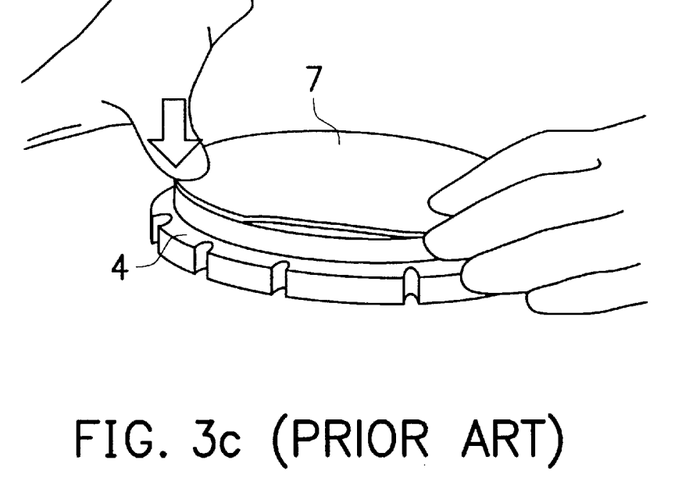
Figure 3D:
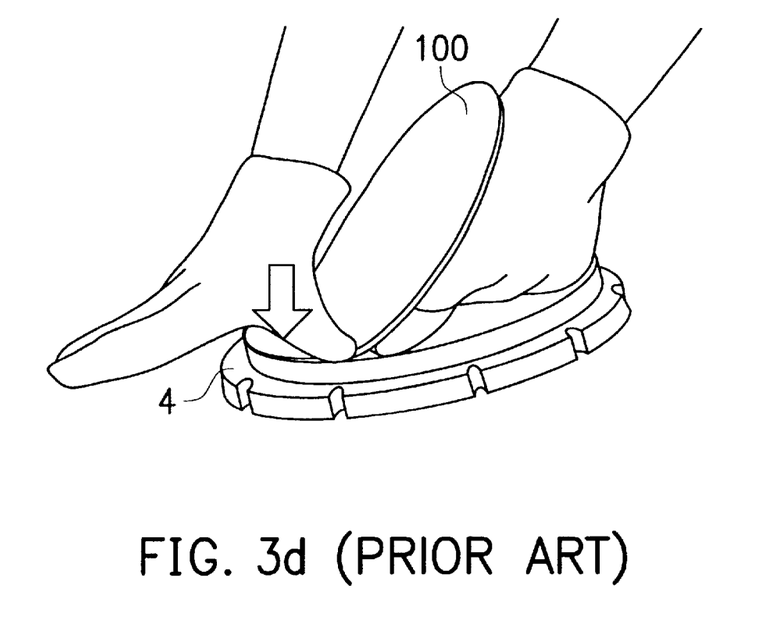
Figure 3E:
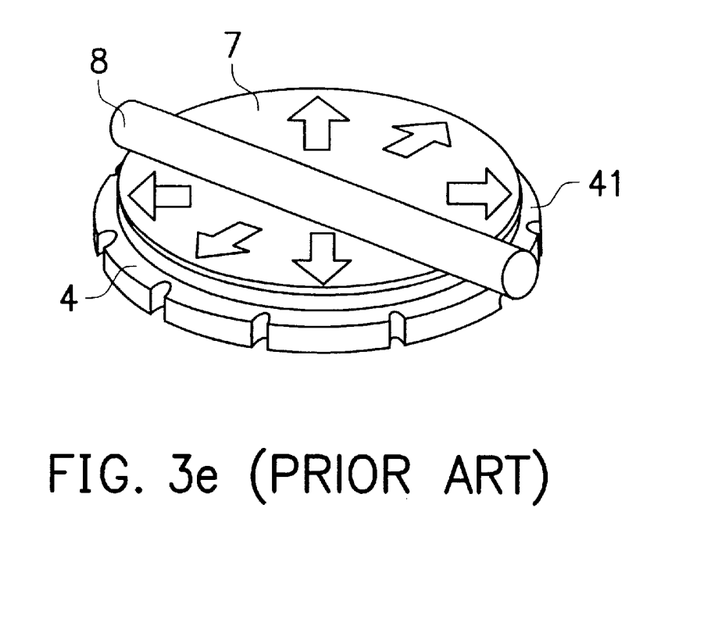

The conventional procedures for changing a backing-film described in detail hereinafter are in reference to FIG. 3a, FIG. 3b, FIG. 3c, FIG. 3d, FIG. 3e, FIG. 3f, FIG. 3g and FIG. 3h. Firstly, as shown in FIG. 3a, the top-ring 4 is disassembled from the shaft 1. Then, after the guide-ring 42 and the cover 43 have been disassembled from the body 41, the used backing-film is removed from the top-ring 4. Referring to FIG. 3b, a new backing-film 7 as shown in FIG. 2c is positioned upon the surface of the top-ring 4 that is to be in contact with the polishing pad 5. The backing-film 7 is aligned with the top-ring 4 afterwards, and a portion of the paper 72 is then peeled off from the sticker 71, as shown in FIG. 3c. FIG. 3d shows the process of adhering the backing-film 7 onto the top-ring 4 wherein the backing-film 4 is adhered to the top-ring 4 and smoothed out completely by means of a roller 8, as shown in FIG. 3e.

Figure 3F:
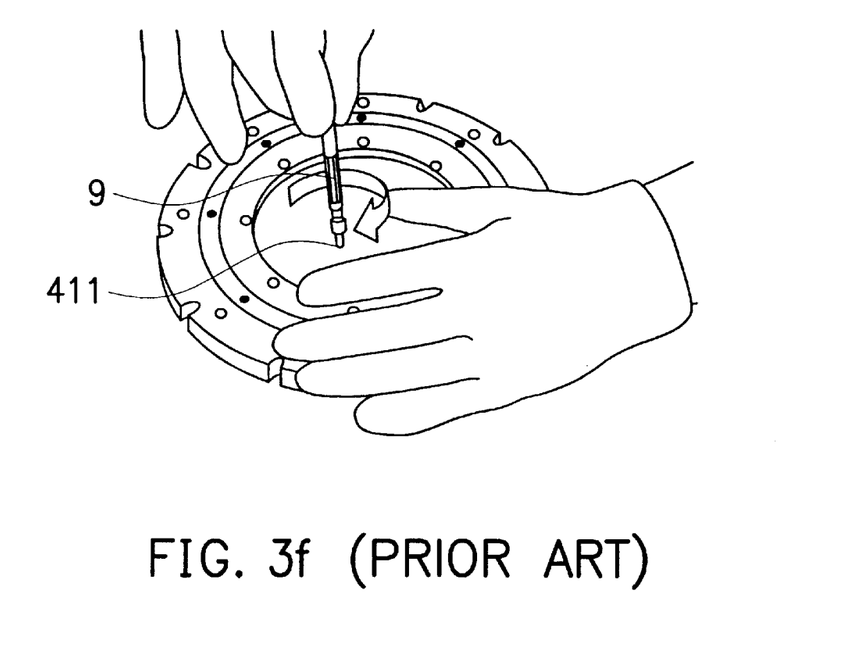
Figure 3G:
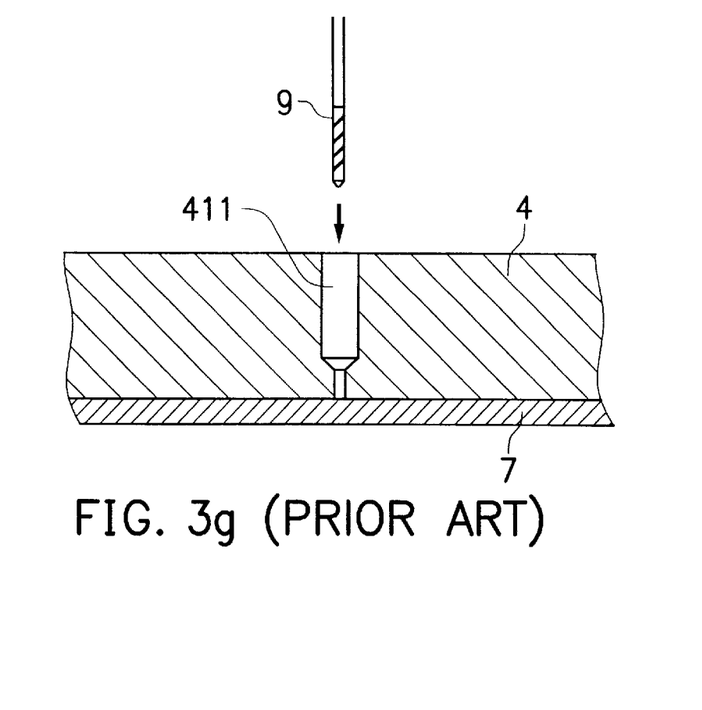
Figure 3H:
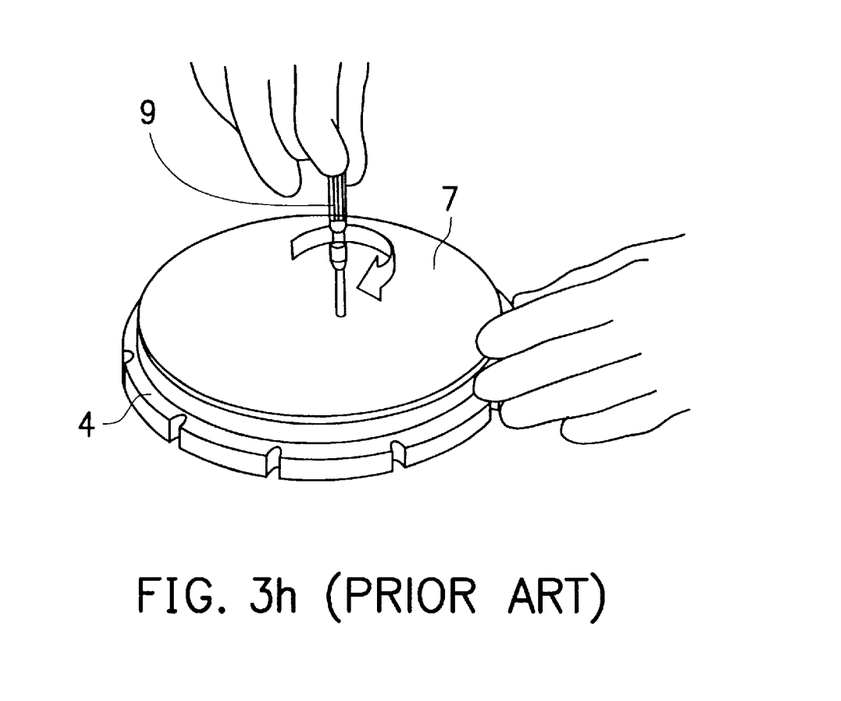

Referring to FIG. 3f, FIG. 3g and FIG. 3h, the process of drilling the backing-film 7 is proceeded after the backing-film 7 is completely adhered to the top-ring 4. Plural holes corresponding to the positions of the air holes 411 are manually drilled by means of a drill 9. Then, the top-ring 4 is turned upside down so as to re-drill the drilled holes from the other end by the drill 9 in order to smooth the drilled holes. The steps shown in FIG. 3f, FIG. 3g and FIG. 3h are repeated until all holes corresponding to the air holes 411 have been drilled. After the drilling process is completed, the guide-ring 42 and the cover 43 are assembled to the body 41. The whole top-ring 4 is then assembled to the shaft 1 to finish this backing-film replacing procedure according to the conventional apparatus and method.

However, the conventional backing-film replacing procedure can have the following disadvantages:

1. The drilling process is typically difficult and laborious. Also, burr tends to be generated to cause untrimmed edge of the drilled hole, which in turn may contribute to unstable and/or inefficient PM. As a result, the down time for the top-ring during a routine PM and QC (quality control) may prove to be too long such that productivity is affected.

2. The burr stated above can easily cause a bad finishing result of the wafer polishing or even the breakage of a wafer. Furthermore, the machine may be halted by such error.

SUMMARY OF THE INVENTION

In view of the disadvantages of the conventional method, the present invention provides a preventive maintenance (PM) method and apparatus for quickly and precisely replacing a backing-film of a chemical mechanical polishing (CMP) machine that can enhance the efficiency of the PM by simplifying the procedures of the PM.

According to the present invention, the backing-film is pre-drilled by laser in order to bypass the restriction set by a conventional manual drilling process on the backing-film. In addition, a PM apparatus for the backing-film comprises an aligning panel having a plural first pins in order to quickly check whether drilled holes of the backing-film area aligned with the corresponding air holes or not. Therefore, the CMP machine down time due to the PM can be reduced.

Furthermore, the steps involved in the preventive maintenance method according to the present invention for a backing-film or a CMP machine are described as below. First of all, a top-ring is disassembled from a shaft of the CMP machine. Then, the top-ring undergoes a cleaning process after a guide-ring is disassembled from the top-ring and the original backing-film is removed. Next, a new backing-film is to be aligned with the above-mentioned aligning panel to make sure that every first pin of the aligning panel aligns with a corresponding through hole. Furthermore, the new backing-film is positioned on the top-ring with the aligning panel where each first pin is inserted through the corresponding air hole. The new backing-film is then adhered to the top-ring, followed by a removal of the aligning panel. Finally, the top-ring is assembled back to the shaft after the guide-ring is assembled to the top-ring.

In addition, the diameter of the through hole is larger than the diameter of the air hole, whereas preferably the diameter of the air hole is 0.8 mm with the diameter of the through hole being 0.8~1.2 mm.

Accordingly, the preventive maintenance apparatus for the backing-film of a CMP machine having a top-ring with plural air holes comprises an aligning panel and plural first pins thereof as described above. The aligning panel is provided with plural first pinholes corresponding to the air holes, wherein each of the first pins is disposed inside the respective first pinhole.

Furthermore, the first pin is provided with a first protrusion and a second protrusion, wherein the second protrusion protrudes from the first protrusion. In particular, the diameter of the first protrusion corresponds to the diameter of the through hole, and the diameter of the second protrusion corresponds to the diameter of the air hole.

Furthermore, the number of the first pinholes of the aligning panel is less than the number of the air holes of the top-ring.

Furthermore, the aligning panel further comprises plural first bases and plural first springs. Each of the first bases is disposed respectively in a first pinhole, and each of the first springs is disposed respectively inside each first pinhole and located between the first pin and the first base.

Furthermore, the apparatus according to the present invention further comprises a check-panel and plural second pins. The check-panel is provided with plural second pinholes that correspond to the layout positions of the air holes, and each of the second pins is disposed inside the second pinhole respectively.

Furthermore, each second pin is provided with a third protrusion and a fourth protrusion protruding from the third protrusion, the diameter of the third protrusion corresponds to the diameter of the through hole, and the diameter of the fourth protrusion corresponds to the diameter of the air hole.

Furthermore, the aligning panel further comprises plural second bases and plural second springs. Each of the second bases is disposed on the respective second pinhole, and each of the second springs is disposed inside the respective second pinhole and located between the second pin and the second base.

The structure of the PM apparatus, as stated above, can help shortening the down time of the CMP machine during a PM procedure, which can enhance the efficiency by simplifying the procedure.

BRIEF DESCRIPTION OF THE DRAWINGS

The invention is hereinafter described in detail by reference to the accompanying drawings in which:

FIG. 3a, FIG. 3b, FIG. 3c, FIG. 3d, FIG. 3e, FIG. 3f, FIG. 3g and FIG. 3h are each illustrating a step in a conventional procedure for replacing a backing-film, wherein FIG. 3g shows a cross-sectional view of FIG. 3f;

DETAILED DESCRIPTION OF THE INVENTION

Figure 4:
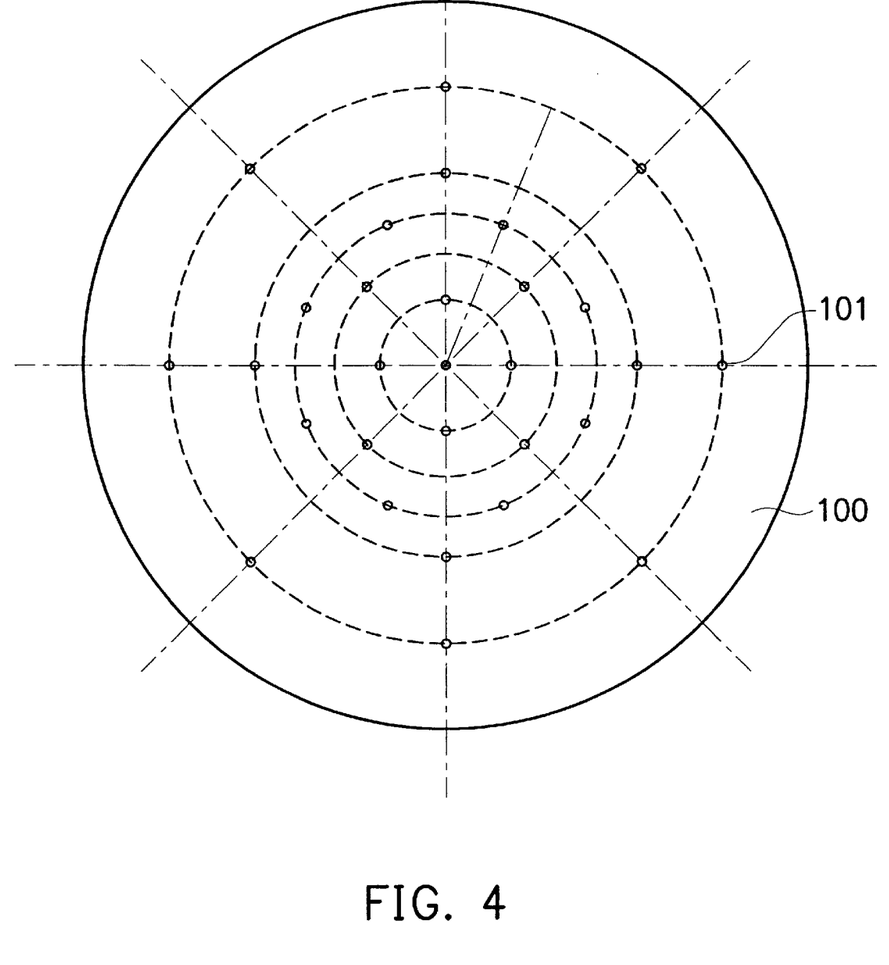
FIG. 4 shows a top view of a backing-film according to the present invention, wherein the through holes shown are pre-drilled by laser.

Referring to FIG. 4, a backing-film 100 used for the present invention is the same as the conventional backing-film shown in FIG. 2c. That is, the adhesive surface of the unused backing-film is covered with a paper. The difference between the backing-film 100 of the present invention and the conventional backing-film is that through holes 101 on the backing-film 100 are pre-drilled by laser before it is mounted onto a top-ring. Therefore, operating time can be reduced with an additional benefit of reducing the burr generated during drilling. In addition, as shown in FIG. 4, the total number of the through holes 101 is twenty-nine, which corresponds to the total number of air holes in the top-ring. However, the number of the through holes is not constrained to this arrangement.

Figure 5:
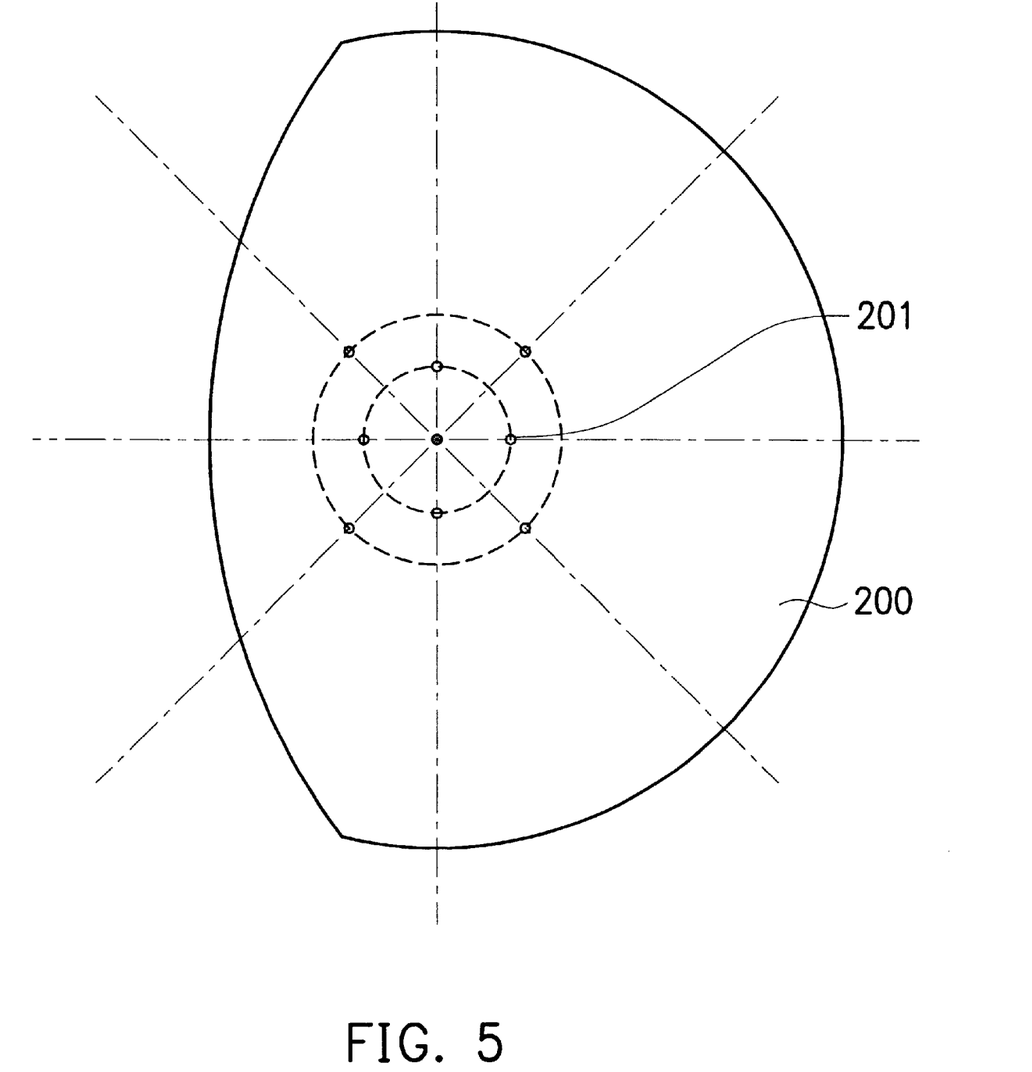
FIG. 5 shows a top view of an aligning panel according to the present invention.
Figure 6:
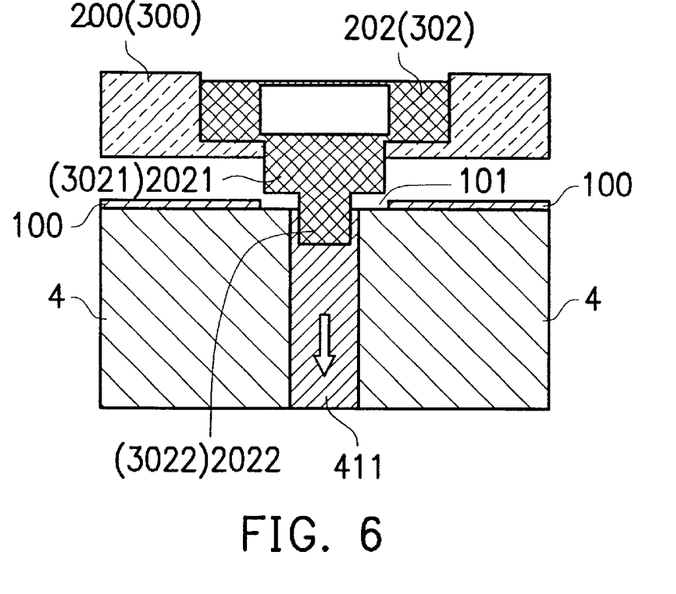
FIG. 6 shows a cross-sectional diagram of a first pin (or a second pin) of the aligning panel (or a check-panel)

Because the above-mentioned, through holes of the backing-film are pre-drilled by laser, an auxiliary tool for expediting the installation and enhancing the precision is needed to quickly adhere the backing-film onto the top-ring. FIG. 5 shows an aligning panel 200 for assisting the installation of the backing-film. The aligning panel 200 is shaped as shown in FIG. 5, which is designed for the convenience of the operator during operation. Furthermore, nine first pinholes 201 corresponding to the layout positions of the air holes of the top-ring are provided on the aligning panel 200. Referring to FIGS. 5 and 6, a plurality of first pins 202 are each disposed in the first pinhole 201 such that each of the first pins 202 can be inserted through a corresponding through hole 101 of the backing-film 100 when aligning the backing-film 100 with the aligning panel 200. In addition, each of the first pins 202 is provided with a first protrusion 2021 and a second protrusion 2022 such that the second protrusion 2022 protrudes from the first protrusion 2021. The diameter of the first protrusion 2021 corresponds to the diameter of the through hole 101, and the diameter of the second protrusion 2022 corresponds to the diameter of the air hole 411.

Referring to FIG. 6, the diameter of the through hole 101 is larger than the diameter of the air hole 411 according to the present invention. Therefore, certain dimensional tolerance is allowed when the through hole 101 is to be aligned with the air hole 411. Despite of such dimensional variation between the through hole 101 and the air hole 411, which is within the limit of the allowable tolerance, desirable aligning precision can still be attained. According to an embodiment of the present invention, the diameter of the air hole 411 is 0.8 mm, and the diameter of the through hole 101 is between 0.8 and 1.2 mm.

Figure 7:
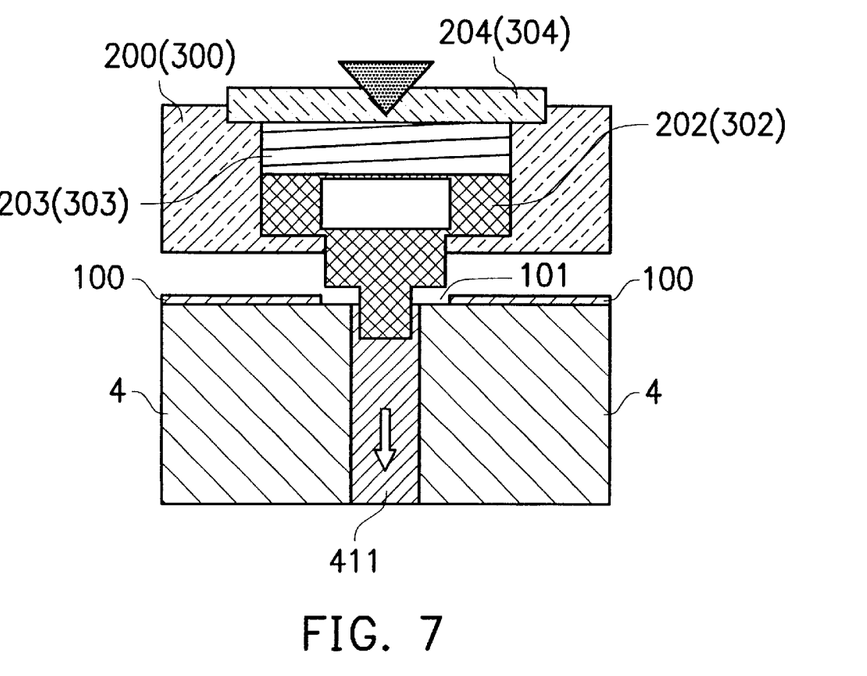
FIG. 7 shows a cross-sectional diagram of base and a spring of an aligning panel (or a check-panel)

FIG. 7 shows a cross-sectional view of a first base 204 and a first spring 203 of the aligning panel 203, wherein each first base 204 is disposed inside the first pinhole 201, and wherein each spring 203 is also disposed inside the first pinhole 201 and between the first pin 202 and first base 204 respectively.

Figure 8:
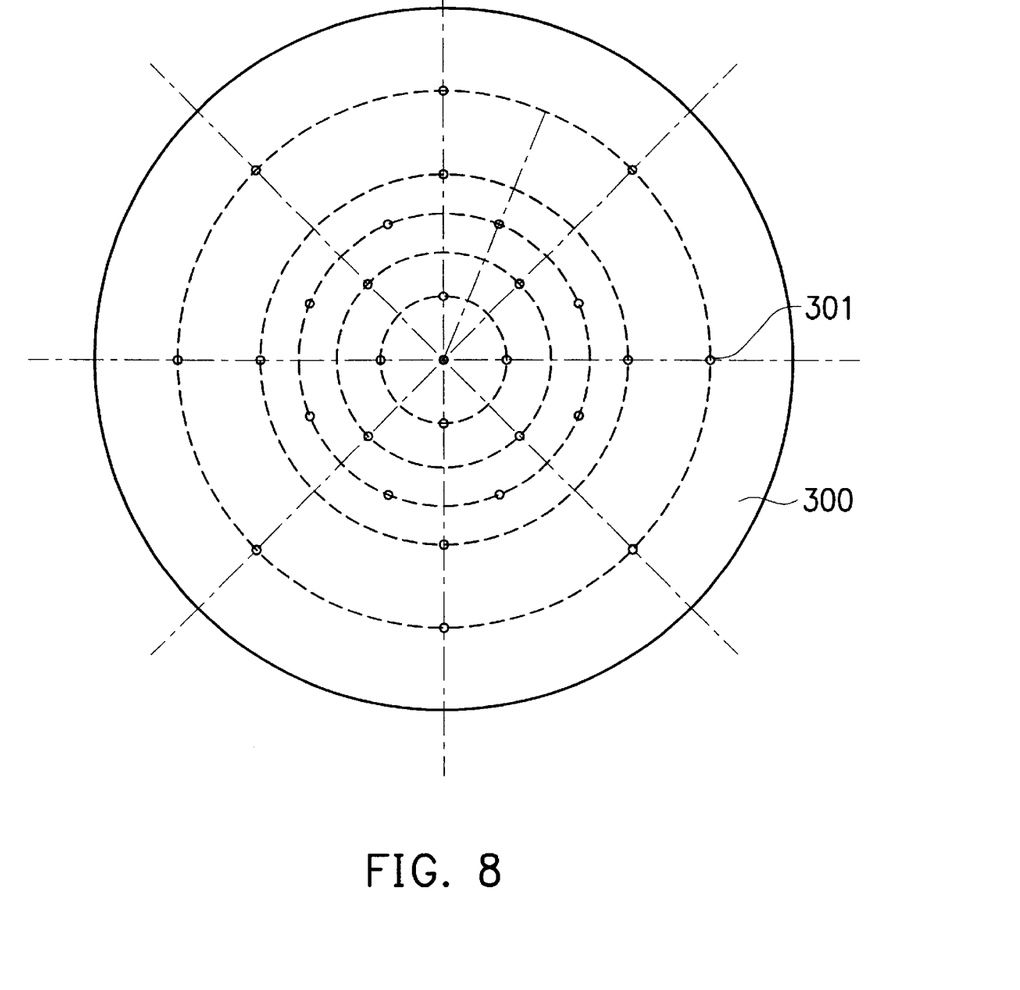
FIG. 8 shows a top view of the check-panel according to the present invention.

FIG. 8 shows the top view of a check-panel 300 according to the present invention. The check-panel 300 is used for checking whether each of the through holes is in alignment with the corresponding air hole or not. The geometrical shape and size of the check-panel 300 are the same as the backing-film where twenty-nine second pinholes 301 are provided on the check-panel 300. Furthermore, each second pinhole 301 is fitted with a second pin 302, a second spring 303, and a second base 304. The check-panel 300 is provided with a third protrusion 3021 and a fourth protrusion 3022, wherein the fourth protrusion 3022 protrudes from the third protrusion 3021. In particular, the diameter of the third protrusion 3021 is corresponds to the diameter of the through hole 101, and the diameter of the fourth protrusion 3022 corresponds to the diameter of the air hole 411 as shown in FIG. 6 and FIG. 7.

Figure 9:
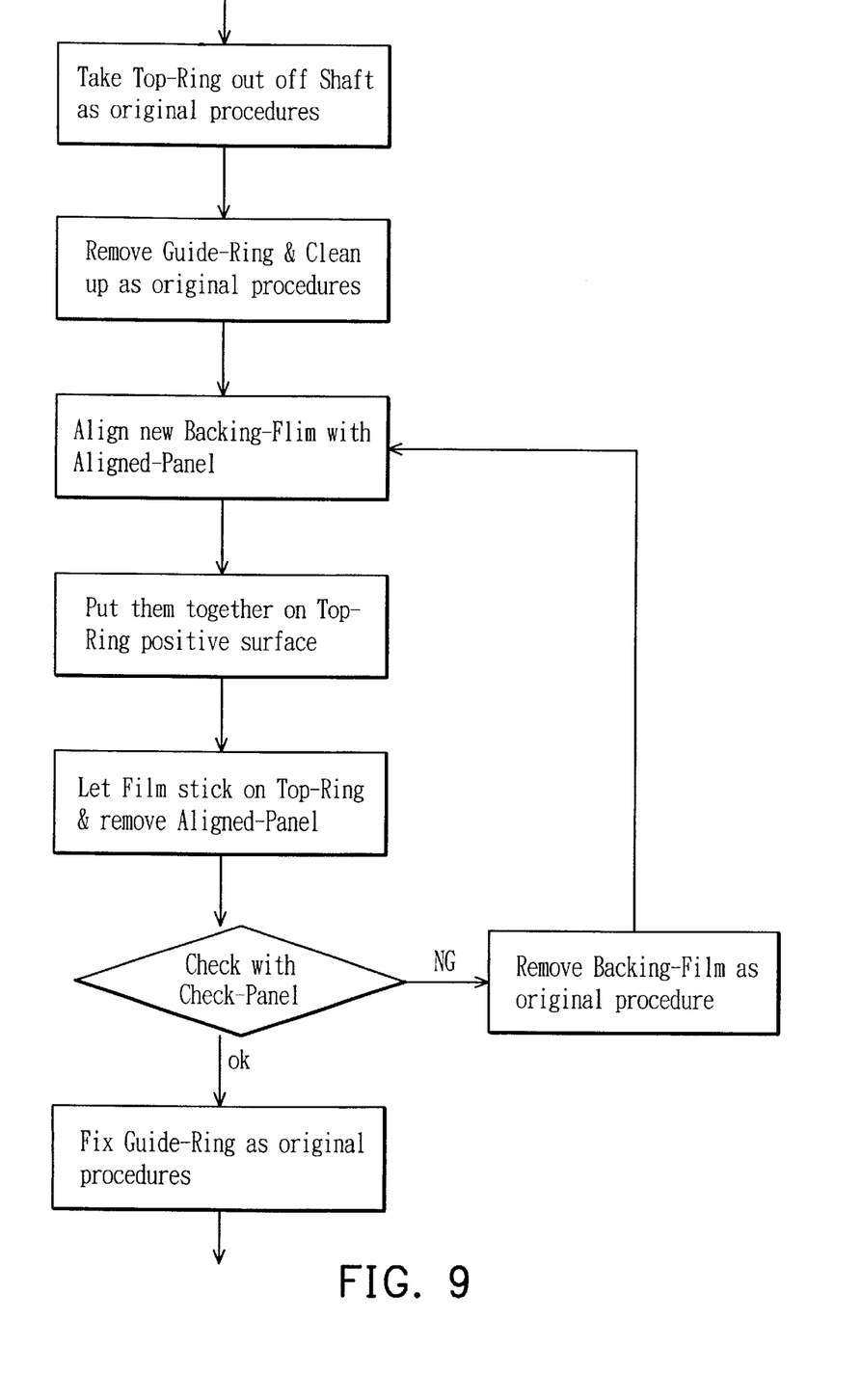
FIG. 9 is a flow chart of the PM method according to the present invention.

FIG. 9 is a flow chart of the PM method according to the present invention. The steps of the PM method are described herewith in reference to FIG. 10a, FIG. 10b, FIG. 10c, and FIG. 10d.

Figure 10A:
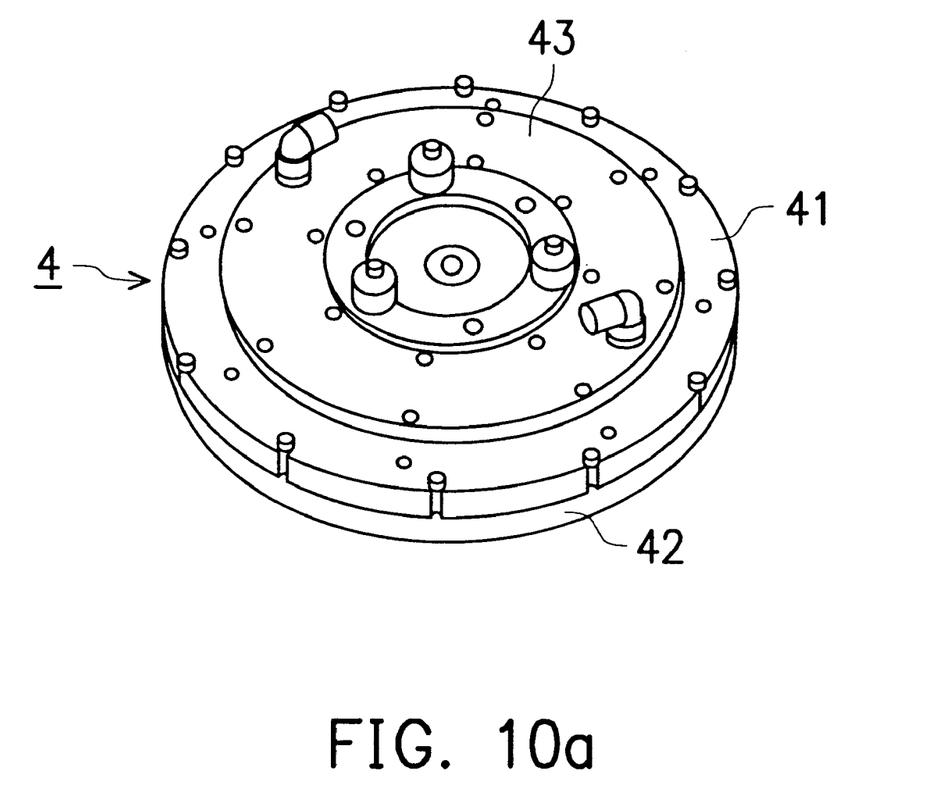
FIG. 10a, FIG. 10b, FIG. 10c and FIG. 10d are each illustrating a step in the procedures for quickly and precisely replacing a backing-film according to the present invention.
Figure 10B:
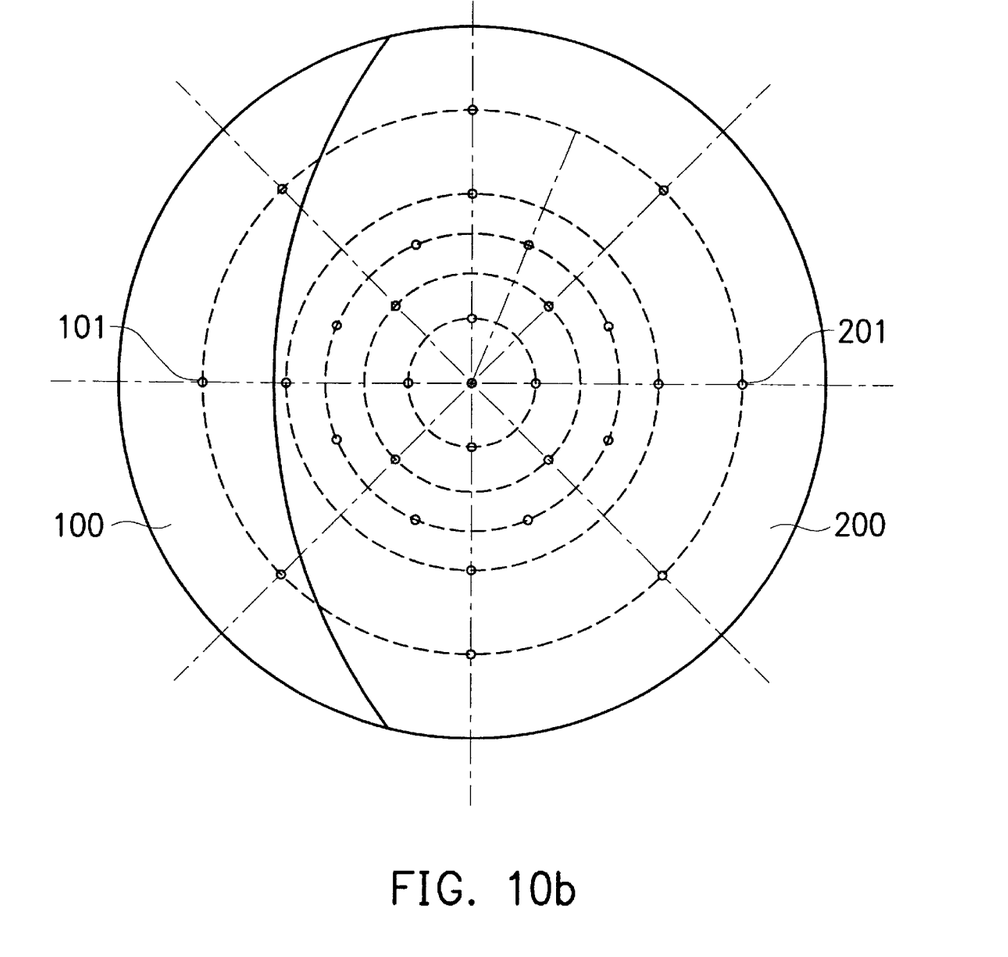
Figure 10C:
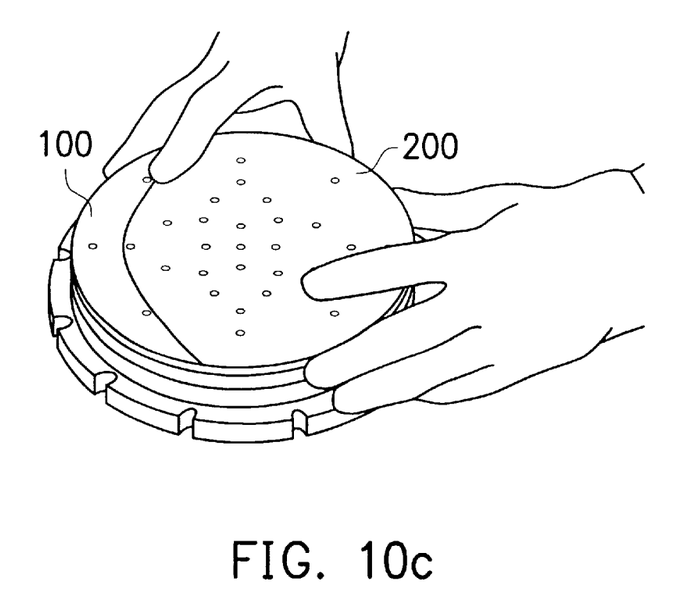
Figure 10D:
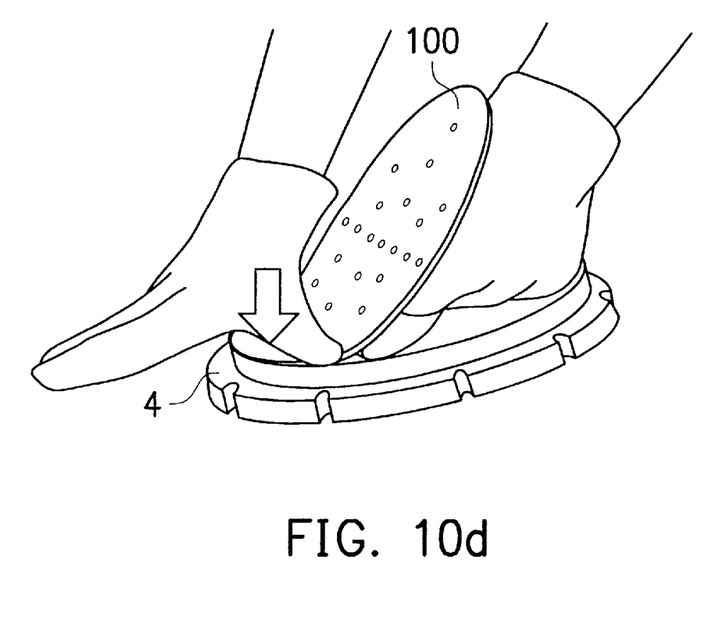

(a) disassembling the top-ring 4 from the shaft 1 as shown in FIG. 10a;

(b) cleaning the top-ring 4 after disassembling the guide-ring 42 from the body 41 and removing the original backing-film without disassembling the cover 43 from the body 41;

(c) aligning a new backing-film 100 with the aligning panel 200, as shown in FIG. 10b, wherein each of the through holes 101 of the backing-film 100 is pre-drilled by laser;

(d) putting the new backing-film 100 on the top-ring 4 along with the aligning panel 200, as shown in FIG. 10c, and inserting each of the first pins 202 through the corresponding through hole 101 and air hole 411;

(e) removing the aligning panel 200 and adhering the new backing-film 100 onto the top-ring 4 as shown in FIG. 10d;

(f) using the check-panel 300 to check whether each of the through holes 101 is in alignment with the corresponding air hole 411; and (g) assembling the top-ring 4 to the shaft 1 after assembling the guide-ring 42 to the top-ring 4.

As stated above, instead of using the conventional manual drilling, the drilling by laser according to the present invention can reduce the operating time while enhancing the quality of the PM procedure. As a result, the efficiency of the PM procedure is increased by simplifying the overall procedure for quickly and precisely replacing a backing-film of a CMP machine.

While the present invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A preventive maintenance method for a backing-film of a CMP machine, comprising the steps of:

(a) providing the CMP machine having a shaft and a detachable top-ring disposed on the shaft, wherein the top-ring is provided with plural air holes, a detachable guide-ring, and a replaceable backing-film, and wherein the backing-film is pre-drilled by laser to produce plural through holes that corresponds to the air holes;

(b) disassembling the top-ring from the shaft before the preventive maintenance for the backing-film is proceeded;

(c) cleaning the top-ring after disassembling the guide-ring from the top-ring and removing the used backing-film.;

(d) providing an aligning panel having plural first pins and plural first pinholes at layout positions corresponding to the air holes of the top-ring, wherein each of the first pins are disposed inside each of the corresponding first pinholes respectively;

(e) aligning a new backing-film with the aligning panel and then inserting each of the first pins through each of the corresponding through holes of the backing-film;

(f) putting the new backing-film on the top-ring along with the aligning panel and inserting each of the first pins through each of the corresponding air holes;

(g) adhering the new backing-film onto the top-ring and then removing the aligning panel; and (h) assembling the top-ring to the shaft after assembling the guide-ring to the top-ring.

2. The method as claimed in claim 1, wherein the diameter of the through hole is larger than the diameter of the air hole.

3. The method as claimed in claim 2, wherein the diameter of the air hole is 0.8 mm, and the diameter of the through hole is between 0.8 and 1.2 mm.

4. The method as claimed in claim 3, wherein the first pin is provided with a first protrusion and a second protrusion that protrudes from the first protrusion, wherein the diameter of the first protrusion corresponds to the diameter of the through hole and wherein the diameter of the second protrusion corresponds to the diameter of the air hole.

5. The method as claimed in claim 4, further comprising the step of:

providing a check-panel for checking whether each of the through holes is in alignment with each of the corresponding air holes prior to step (h), wherein the check-panel is provided with plural second pinholes formed at layout positions that correspond to the air holes, and wherein each of the second pins is disposed inside the corresponding second pinhole respectively.

6. The method as claimed in claim 5, wherein the second pin is provide with a third protrusion and a fourth protrusion that protrudes from the third protrusion, wherein the diameter of the third protrusion corresponds to the diameter of the through hole, and wherein the diameter of the fourth protrusion corresponds to the diameter of the air hole.

* * * * *

UNITED STATES PATENT AND TRADEMARK OFFICE
CERTIFICATE OF CORRECTION

PATENT NO.    : 6,305,062 B1
DATED         : October 23, 2001
INVENTOR(S)   : Ting-Kou Chen et al.

It is certified that error appears in the above-identified patent and that said Letters Patent is hereby corrected as shown below:

<u>Title page,</u>
Item [30], should read as follows:
-- [30]   Foreign Application Priority Data
December 2, 1999  (TW) ……………..088121051 --

Signed and Sealed this

Twenty-fourth Day of December, 2002

JAMES E. ROGAN
*Director of the United States Patent and Trademark Office*